United States Patent [19]

Heimbigner

[11] 4,302,765

[45] Nov. 24, 1981

[54] GEOMETRY FOR FABRICATING ENHANCEMENT AND DEPLETION-TYPE, PULL-UP FIELD EFFECT TRANSISTOR DEVICES

[75] Inventor: Gary L. Heimbigner, Anaheim, Calif.

[73] Assignee: Rockwell International Corporation, El Segundo, Calif.

[21] Appl. No.: 118,041

[22] Filed: Feb. 4, 1980

Related U.S. Application Data

[63] Continuation of Ser. No. 939,768, Sep. 5, 1978, abandoned.

[51] Int. Cl.³ ............................................. H01L 29/78
[52] U.S. Cl. ..................................... 357/23; 357/41; 357/59; 357/68
[58] Field of Search ................. 357/23, 41, 59, 68

[56] References Cited

U.S. PATENT DOCUMENTS

| | | | |
|---|---|---|---|
| 3,969,745 | 7/1976 | Blocker | 357/22 |
| 4,062,039 | 12/1977 | Nishimura | 357/51 |
| 4,084,108 | 4/1978 | Fujimoto | 307/238 |
| 4,125,854 | 11/1978 | McKenny | 357/41 |
| 4,180,826 | 12/1979 | Shappir | 357/41 |
| 4,185,319 | 1/1980 | Stewart | 365/185 |
| 4,208,670 | 6/1980 | Hoffman | 357/45 |

Primary Examiner—Martin H. Edlow
Attorney, Agent, or Firm—H. Fredrick Hamann; Daniel R. McGlynn; Wilfred G. Caldwell

[57] ABSTRACT

An improved layout for controlling the channel length of silicon gate, enhancement and depletion pull-up field effect transistor devices. The improved layout enables a transistor device to be fabricated with minimal size and at minimum channel length tolerance.

4 Claims, 5 Drawing Figures

GEOMETRY FOR FABRICATING ENHANCEMENT AND DEPLETION-TYPE, PULL-UP FIELD EFFECT TRANSISTOR DEVICES

This is a continuation of application Ser. No. 939,768 filed Sept. 5, 1978, now abandoned.

BACKGROUND OF THE INVENTION

1. Field of the Invention

This invention relates to an improved layout for fabricating silicon gate depletion and enchancement pull-up field effect transistor devices.

2. Prior Art

Several layouts are known in the prior art for silicon gate enhancement and depletion-type, pull-up field effect transistor devices. However, such prior art layouts require relatively large chip area 3, and moreover have relatively poor channel dimension tolerance. As a result, the prior art layouts are unsuitable in microcircuit applications wherein a plurality of such transistor devices are fabricated in close alignment with one another on a semiconductor wafer or chip. U.S. Pat. No. 3,699,646, incorporated herein by reference, shows a field effect transistor structure in which a polysilicon gate structure is connected directly to a diffused silicon area on the substrate.

SUMMARY OF THE INVENTION

Briefly, and in general terms, the present invention provides an improved geometrical configuration of silicon gate, enhancement and depletion-type field effect transistor devices. More particularly, the present invention provides an integrated circuit comprising a substrate of semiconductor material of a first conductivity type, a field effect transistor formed in the substrate, including a channel diffusion region, a source diffusion region, and a drain diffusion region, and a polysilicon layer disposed on the substrate. The polysilicon layer includes a first portion forming the gate electrode of the field effect transistor, and a second portion electrically connected to the first portion, the entire second portion overlapping and directly electrically connected to a portion of the source diffusion region. The first portion includes a first edge substantially adjacent the drain diffusion region forming one end of the channel region of the field effect transistor, and a second edge substantially adjacent the source diffusion region forming the other end of the channel region, the second edge being spaced from the second portion. The polysilicon layer also includes a third portion which electrically connects the first portion and the second portion, the third portion being disposed on the substrate so that the normal projection of the third portion on the plance of the substrate lies entirely within the channel diffusion region.

DESCRIPTION OF THE PREFERRED EMBODIMENT

Figure 1:
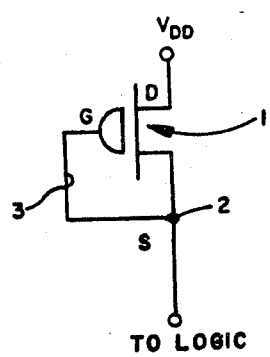
FIG. 1 illustrates a well known symbolic representation for a depletion-type field effect transistor.

FIG. 1 of the drawings illustrates a well known symbolic representation of a depletion-type field effect transistor (FET) 1. Depletion FET 1 includes respective gate (G), source (S) and drain (D) electrodes, as shown. The gate electrode of depletion FET 1 is connected to the source electrode thereof at an electrical junction 2 by means of a conductor line 3. The drain electrode of FET 1 is connected to a source of reference potential, designated $V_{DD}$.

Figure 2:
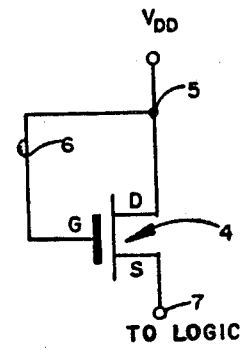
FIG. 2 illustrates a well known symbolic representation for an enhancement-type field effect transistor.

FIG. 2 of the drawings illustrates a well known symbolic representation of an enhancement-type field effect transistor (FET) 4. Enhancement FET 4 includes respective gate, source and drain electrodes, as shown. The gate electrode of enhancement FET 4 is connected to the drain electrode thereof and to a source of reference potential $V_{DD}$ at an electrical junction 5 by means of a conductor line 6. The source electrode of FET 4 is connected to logic means (not shown) via an electrical junction 7. By virtue of the respective interconnections (via conductor lines 3 and 6) of the gate to one conduction path electrode of each of the depletion and enhancement FETs 1 and 4 of FIGS. 1 and 2, FETs 1 and 4 operate as "pull-up" devices which function in a circuit as load resistors. However, such pull-up transistor devices or load resistors of the prior art are fabricated with either undesirably large geometries or large channel length tolerances.

Figure 3:
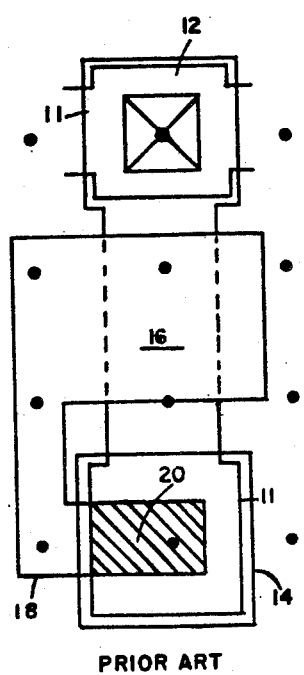
FIGS. 3 and 4 illustrate examples of prior art layouts of silicon gate, pull-up field effect transistors.

FIG. 3 shows one prior art layout of a silicon gate, pull-up field effect transistor. The layout of FIG. 3 may for example correspond to the depletion FET 1 of FIG. 1. The transistor device includes an elongated diffusion region 11 in the major surface of the semiconductor. The fabrication process for self-aligned silicon gate devices is well known in the art and need not be described in detail here. U.S. Pat. Nos. 3,928,082, 3,948,6, 3,967,981, and 3,900,352, each incorporated herein by reference, describe various self-aligned semiconductor structures. For our purpose in understanding the present invention, it is merely necessary to repeat the teaching of the prior art references that after the the elongated diffusion region (e.g. 11) has been defined in the semiconductor body, a layer of oxide is typically grown thereover. A polysilicon gate electrode may then be provided over the thin oxide, thereby forming the gate electrode. The polysilicon gate electrode may then be used as the mask for forming the heavily doped source and drain regions which are formed in the diffusion region (e.g. 11). In order for various electrical conductors of the circuit to make electrical contact with portions of the diffused region, a contact mask (sometimes called a "silicon contact" or a "buried contact" mask) is used in the fabrication process for making electrical contact between the aluminum conductor (e.g. 12) or the polysilicon layer (e.g. 18) and the diffused region in the semiconductor body. One end portion of the diffusion region 11 makes contact with a horizontally extending layer area of metalization 12. The opposite end portion diffusion region 11 makes physical and electrical contact with the polysilicon layer 18. A portion of the diffusion region 11 that is formed between the metalization 12 and the region formed by contact mask 14 defines the channel region 16 of the field effect transistor device. A U-shaped polysilicon layer 18 extends between the second end of diffusion region 11 (i.e. the source electrode) and the channel region 16. This polysilicon layer 18 corresponds to the conductor line 3 which connects the gate to the source electrode of FET 1 in FIG. 1. The area of mutual overlap of the polysilicon layer 18, the diffusion region 11 and the buried contact mask 14 forms what can be called a "contact area" 20 (shown cross-hatched) which forms a physical and electrical contact between the polysilicon and the diffused region of the transistor device. The contact area 20 corresponds to the electrical junction 2 in FIG. 1. As will be recognized by those skilled in the art, on a well known grid type layout arrangement (where the grid comprises an array of equally spaced intersections shown by heavy "dots" in FIGS. 3, 4, and 5 that are typically 11 microns apart), the U-shaped polysilicon layer 18 is typically two grids wide, while the channel region 16 is only a single grid wide. This relatively large polysilicon width is disadvantageous in applications (e.g. such as VLSI techniques) wherein large numbers of devices are to be fabricated in close alignment with one another, inasmuch as a large layout area is required for the device.

Figure 4:
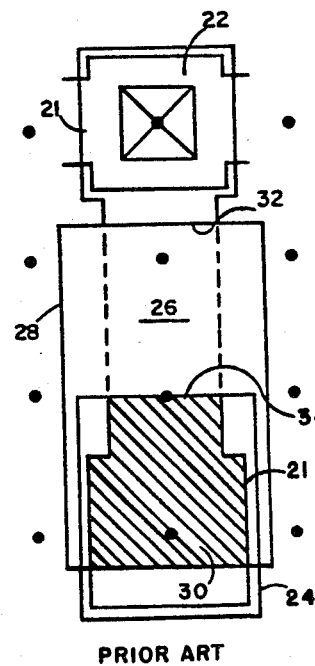

FIG. 4 shows another prior art layout of a silicon gate, depletion-type pull-up field effect transistor 1 of FIG. 1. The transistor device includes an elongated diffusion region 21. One end portion of diffusion region 21 makes contact with a horizontally extending area of metalization 22, and the second end portion of diffusion region 22 makes physical and electrical contact with polysilicon layer 28. A portion of the diffusion region 21 that is formed between the metalization 22 and the region formed by the contact mask 24 defines the channel region 26. A rectangular polysilicon layer 28 extends over both the channel region 26 and a portion of the contact mask region 24. The area of mutual overlap of the polysilicon layer 28, the diffusion region 21 and the contact mask region 24 forms a contact area 30 (shown cross-hatched) of the transistor device. As will be recognized by those skilled in the art, the length of the active channel region 26 (shown dotted) of the transistor device of FIG. 4 is determined by the distance between the drain and source edges 32 and 34 of the polysilicon layer 28 and the contact mask region 24, respectively. Inasmuch as each of the source and drain edges 32 and 34 is independently aligned relative to the diffusion mask region 21, relatively poor channel dimensional control (i.e. relatively large channel length tolerances) may occur as a consequence of misalignments within the transistor device geometry of FIG. 4. By way of example, such a geometry may typically result in a channel length of 11±4 microns.

Figure 5:
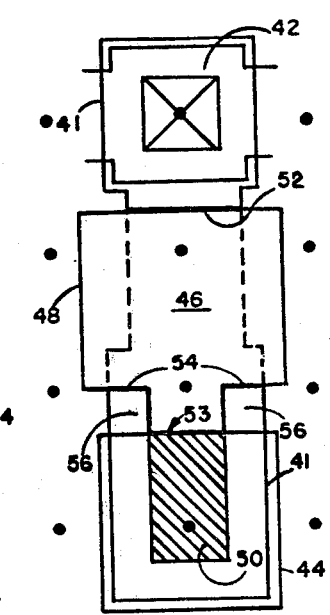
FIG. 5 illustrates a preferred layout of a silicon gate, pull-up field effect transistor according to the present invention.

FIG. 5 of the drawings shows the preferred layout of a silicon gate, pull-up field effect transistor device. The preferred transistor layout includes an elongated diffusion region 41. One end portion of diffusion region 41 is makes contact with an area of metalization 42. The second end portion of diffusion region 41 makes physical and electrical contact with the polysilicon layer 48. A portion of the diffusion region 41 that is formed between the metalization 42 and the region formed by the contact mask 44 defines the channel region 46. A polysilicon layer 48 extends over both the channel region 46 and a portion of the contact mask region 44. Of course, an insulating layer (not shown) electrically isolates the polysilicon layer 48 from the semiconductor substrate except at explicitly labelled contact points. The area of mutual overlap of polysilicon layer 48, diffusion region 41 and contact mask region 44 forms a contact area 50 (shown cross-hatched) of the transistor device where direct physical and electrical contact is made between the polysilicon layer 48 and the diffusion region 41. By way of example, polysilicon layer 48 corresponds to the conductor line 3, and contact area 50 corresponds to the electrical junction 2 of the depletion-type transistor device 1 in FIG. 1.

In accordance with the present invention, the polysilicon layer 48 is a substantially linear conductor (unlike the U-shaped layer 18 employed in the transistor geometry of FIG. 3) that connects the active channel region 46 (shown dotted) between the drain and source edges 52 and 53 of the transistor device. Thus, the length of the transistor active channel region 46 (i.e. between the drain and source edges 52 and 53) is generally determined by the upper and lower edges of polysilicon layer 48 (rather than by the edges 32 and 34 of the polysilicon layer 28 and the region of the contact mask 24, respectively, of the transistor geometry in FIG. 4) which, thereby, improves tolerance control. Moreover, the transistor layout of FIG. 5 defines a first edge of the source region as line 53. Two spaced regions of source diffusion 56 are formed in the diffusion region 41 between each of two of the source edges 54 of polysilicon layer 48 and the contact mask region 44. More particularly, the length (i.e. the distance between polysilicon layer source edges 54 and the contact mask region 44) of each of the source diffusion regions 56 is equivalent to the sum of the alignment tolerance of each of the respective polysilicon layer 48 and region of the contact mask 44. Therefore, polysilicon layer 48 and contact mask 44 will be unable to overlap one another in the event of geometrical misalignments, so that (unlike the transistor geometry of FIG. 4) an efficient means of channel length control is provided.

By virtue of the improved geometry of FIG. 5, both depletion and enhancement-type, pull-up field effect transistor devices may be efficiently fabricated, which devices consume minimized layout space without sacrificing control of channel length tolerance. Hence, the transistor geometry may be substantially aligned on one width of grid layout. This is highly advantageous when large arrays of such transistors and associated devices are closely spaced from one another on a microelectronic wafer or chip. What is more, minor misalignments in the transistor geometry of FIG. 5 will not undesirably change the length of the channel region 46. By way of example, channel length tolerance is minimized to approximately ±¼ micron.

It will be apparent that while a preferred embodiment of the invention has been shown and described, various modifications and changes may be made without departing from the true spirit and scope of the invention.

Having thus set forth a preferred embodiment of the present invention, what is claimed is:

1. An integrated circuit comprising:
   a substrate of semiconductor material of a first conductivity type;
   a field effect transistor formed in said substrate, including a channel diffusion region, a source diffusion region, and a drain diffusion region; and
   a polysilicon layer disposed on said substrate, said layer including a first portion forming the gate electrode of said field effect transistor, a second portion electrically connected to said first portion, said entire second portion overlapping and directly electrically connected to a portion of said source diffusion region, said first portion including a first edge substantially adjacent said drain diffusion region forming one end of said channel region of said field effect transistor, and a second edge substantially adjacent said source diffusion region forming the other end of said channel region, said second edge being spaced from said second portion, and a third portion electrically connecting said first portion and said second portion, said third portion being disposed on said substrate so that the normal projection of said third portion on the plane of said substrate lies entirely within said channel diffusion region.

2. An integrated circuit as defined in claim 1, wherein said first portion is substantially square in shape.

3. An integrated circuit as defined in claim 1, wherein said second portion is substantially rectangular in shape.

4. An integrated circuit as defined in claim 1, wherein said second portion meets said third portion at a portion of said second edge, said second edge being divided into three substantially equal, non-overlapping, and adjacent subportions, said portion of said second edge forming the second of said three subportions.

* * * * *

UNITED STATES PATENT AND TRADEMARK OFFICE
CERTIFICATE OF CORRECTION

PATENT NO. : 4,302,765
DATED : November 24, 1981
INVENTOR(S) : G. L. Heimbigner

It is certified that error appears in the above-identified patent and that said Letters Patent are hereby corrected as shown below:

In Column 2, line 60, please insert --other-- before "opposite".

In Column 3, line 8, please delete "." following the word "region".

In Column 4, line 53 and 54 should not be a new paragraph but the last sentence in the paragraph above it.

Signed and Sealed this

Sixteenth Day of November 1982

[SEAL]

Attest:

*Attesting Officer*

GERALD J MOSSINGHOFF

*Commissioner of Patents and Trademarks*